(12) United States Patent
Hartmann et al.

(10) Patent No.: US 9,237,674 B2
(45) Date of Patent: Jan. 12, 2016

(54) FILTER UNIT FOR A SWITCHGEAR CABINET

(75) Inventors: Reiner Hartmann, Wettenberg (DE); Steffen Wagner, Burbach (DE); Stefan Schneider, Bad Endbach (DE)

(73) Assignee: RITTAL GMBH & CO. KG, Herborn (DE)

( * ) Notice: Subject to any disclaimer, the term of this patent is extended or adjusted under 35 U.S.C. 154(b) by 175 days.

(21) Appl. No.: 13/261,476

(22) PCT Filed: Mar. 15, 2011

(86) PCT No.: PCT/EP2011/053892
§ 371 (c)(1),
(2), (4) Date: Nov. 27, 2012

(87) PCT Pub. No.: WO2011/131424
PCT Pub. Date: Oct. 27, 2011

(65) Prior Publication Data
US 2013/0067875 A1    Mar. 21, 2013

(30) Foreign Application Priority Data
Apr. 19, 2010 (DE) .......................... 10 2010 016 504

(51) Int. Cl.
*B01D 46/00* (2006.01)
*H05K 7/20* (2006.01)
*B01D 46/10* (2006.01)

(52) U.S. Cl.
CPC ........ *H05K 7/20009* (2013.01); *B01D 46/0002* (2013.01); *B01D 46/0004* (2013.01);
(Continued)

(58) Field of Classification Search
CPC ........... B01D 46/0002; B01D 46/0004; B01D 46/0005; B01D 46/0026; B01D 46/10; B01D 2265/02; B01D 2273/30; B01D 2279/45; H05K 7/20009; H05K 7/20181; Y10T 16/53625; Y10T 16/5403; Y10T 16/54038; E05D 1/00; E05D 1/04; E05D 1/06
USPC ....... 55/493, 418, 506, 481, 80, 471, DIG. 35
See application file for complete search history.

(56) References Cited

U.S. PATENT DOCUMENTS 880,757 A * 3/1908 Rugg .............................. 16/269
1,566,236 A * 12/1925 Skurdal .......................... 16/269
(Continued)

FOREIGN PATENT DOCUMENTS

DE    35 32 169 A1    4/1987
DE    195 05 583 A1   8/1996
(Continued)

OTHER PUBLICATIONS

Hassel, DE 3532169, Sep. 10, 1985, Espacenet Patent Translate, all pages.*

Primary Examiner — Amber Orlando
Assistant Examiner — Britanny Precht
(74) Attorney, Agent, or Firm — Marshall & Melhorn, LLC

(57) ABSTRACT

The invention relates to a filter unit for a switchgear cabinet, comprising a filter housing having an air passage that can be covered by an air passage grating at least to some extent.
To allow such a filter unit to be maintenanced easily, it provided according to the invention that the air passage grating is hinged indirectly or directly to the filter housing and can be adjusted between a closed position and an opened maintenance position. The filter housing has a retainer which positively blocks a catch of the air passage grating in the maintenance position.

9 Claims, 3 Drawing Sheets

(52) U.S. Cl.
CPC ........ *B01D46/0005* (2013.01); *B01D 46/0026* (2013.01); *B01D 46/10* (2013.01); *H05K 7/20181* (2013.01); *B01D 2265/02* (2013.01); *B01D 2273/30* (2013.01); *B01D 2279/45* (2013.01)

(56) References Cited

U.S. PATENT DOCUMENTS

| | | | |
|---|---|---|---|
| 2,010,809 A * | 8/1935 | Braine | 454/205 |
| 3,663,990 A * | 5/1972 | Shane | 16/269 |
| 4,694,533 A * | 9/1987 | Doyen | 16/257 |
| 4,771,816 A * | 9/1988 | Clay, Jr. | 160/235 |
| 4,787,121 A * | 11/1988 | Racenis et al. | 16/356 |
| 4,852,213 A * | 8/1989 | Shewchuk | 16/266 |
| 4,914,781 A * | 4/1990 | Sokn et al. | 16/225 |
| 5,017,039 A * | 5/1991 | Spiess et al. | 404/25 |
| 5,075,927 A * | 12/1991 | Porta | 16/273 |
| 5,352,256 A * | 10/1994 | Stead et al. | 55/323 |
| 5,365,993 A * | 11/1994 | Jella | 160/201 |
| 5,480,197 A * | 1/1996 | Ernst et al. | 292/113 |
| 5,569,311 A * | 10/1996 | Oda et al. | 55/493 |
| 5,679,121 A | 10/1997 | Kim | |
| 5,746,794 A | 5/1998 | Hamm et al. | |
| 5,914,413 A * | 6/1999 | Andersson et al. | 55/378 |
| 6,110,245 A * | 8/2000 | Schlag | B01D 46/001 454/184 |
| 6,174,343 B1 * | 1/2001 | Bloomer | 55/385.3 |
| 6,217,835 B1 * | 4/2001 | Riley et al. | 422/297 |
| 6,284,011 B1 * | 9/2001 | Chiang et al. | 55/471 |
| 6,354,936 B1 * | 3/2002 | Noh et al. | 454/201 |
| 6,494,940 B1 * | 12/2002 | Hak | 96/224 |
| 6,687,956 B1 * | 2/2004 | Foo | 16/269 |
| 6,942,710 B2 * | 9/2005 | Milano | 55/480 |
| 7,077,893 B2 * | 7/2006 | Guilliard | 96/414 |
| 7,900,316 B2 * | 3/2011 | Fester et al. | 15/327.2 |
| 8,002,868 B2 * | 8/2011 | Kim et al. | 55/481 |
| 8,152,885 B2 * | 4/2012 | Pfannenberg | 55/478 |
| 8,598,456 B2 * | 12/2013 | Carbone et al. | 174/66 |
| 2002/0073664 A1 * | 6/2002 | Campbell et al. | 55/471 |
| 2004/0098959 A1 * | 5/2004 | Guilliard | B01D 46/0004 55/490 |
| 2006/0032198 A1 * | 2/2006 | Cha et al. | 55/418 |
| 2008/0014858 A1 * | 1/2008 | Pfannenberg | B01D 46/004 454/276 |
| 2008/0043432 A1 * | 2/2008 | Hung | G06F 1/181 361/695 |
| 2008/0045134 A1 * | 2/2008 | Pfannenberg | H05K 7/20181 454/184 |
| 2008/0045135 A1 * | 2/2008 | Pfannenberg | F04D 29/646 454/184 |
| 2008/0053049 A1 * | 3/2008 | Pfannenberg | 55/493 |
| 2008/0314357 A1 * | 12/2008 | Sasano et al. | 123/198 E |
| 2009/0075582 A1 * | 3/2009 | Wilkerson | 454/298 |
| 2010/0257828 A1 * | 10/2010 | Shimomura et al. | 55/493 |
| 2012/0073207 A1 * | 3/2012 | Shearer | 49/386 |
| 2013/0035032 A1 * | 2/2013 | Schneider et al. | 454/278 |

FOREIGN PATENT DOCUMENTS

| | | |
|---|---|---|
| DE | 196 07 590 A1 | 8/1996 |
| DE | 197 00 065 A1 | 5/1998 |
| DE | 20 2004 006 784 U1 | 8/2004 |
| DE | 20 2006 012 058 U1 | 12/2007 |
| EP | 1 947 547 A1 | 7/2008 |

* cited by examiner

FILTER UNIT FOR A SWITCHGEAR CABINET

BACKGROUND OF THE INVENTION

The invention relates to a filter unit for a switchgear cabinet comprising a filter housing having an air passage that can be covered by an air passage grating at least to some extent.

Filter units of this type are used in switchgear cabinet construction. A cut-out is made in a switchgear cabinet wall which is covered by the filter unit. Via the filter unit, for example ambient air may be sucked and guided into the interior of the switchgear cabinet for cooling purposes. Often, fan modules are combined with the filter units which are flange-mounted to the filter housing. The fan modules actively convey ambient air into the interior of the switchgear cabinet. To avoid contamination of the interior of the switchgear cabinet, filter mats are retained in the filter housings. They must, when strongly soiled, regularly be exchanged, especially in installment regions. To this end, the air passage grating is removed by authorized qualified personnel and put aside. Subsequently, the filter mat is removed and replaced by a new one.

SUMMARY OF THE INVENTION

It is the object of the invention to create a filter unit of the type mentioned in the introductory, for which filter mat exchange may be performed easily to service.

This object is achieved in that the air passage grating is hinged indirectly or directly to the filter housing and can be adjusted between a closed position and an opened maintenance position and that the filter housing has a retainer which positively blocks a catch of the air passage grating in the maintenance position.

For maintenance of the filter unit, a user may fold down the air passage grating in the hinge connection, so that a fixed association of the filter housing and of the air passage grating remains intact and the air passage grating does not need to be put aside separately. The movement of the air passage grating is blocked by means of the retainer and by means of the catch. As soon as the air passage grating reaches its maintenance position, the catch engages with the holder. Then, the filter mat is accessible and may be replaced conveniently. When the air passage grating is brought into a defined maintenance position, it is prevented that the filter mat may inadvertently fall down to the floor.

According to a preferred variant of the invention, it may be provided that a damper is effective between the air passage grating and the filter housing which decelerates the pivot cell movement of the air passage grating at least in a part of the opening stroke. In this way, maintenance is further optimized in that the air passage grating does not fall into the maintenance position without being decelerated.

A simple technical construction is achieved in that the damper is a friction damper. It may in particular be provided that the retainer comprises a friction surface, the catch moving thereon with a counter friction surface, so that no additional parts are required.

To increase the operational safety it may be provided that the retainer is pressed spring-biased to the catch at least in a part of the opening stroke. Thus, a defined association between retainer and catch is always achieved.

A filter unit according to the invention may be configured such that each of holder and catch comprises a hook-shaped tab, which tabs engage each other in the maintenance position. Holder and catch find each other always reliably via the hook-shaped geometries and form a safe positive fit in the maintenance position.

If it is provided that the air passage grating comprises a mat holder retaining a filter mat replaceably, the filter mat may be folded down together with the air passage grating and is then conveniently accessible for the maintenance staff.

A particularly preferred embodiment of the invention provides that the air passage grating carries the catch in the region of the hinge side. In this way, the free accessibility to the filter housing is not or only unimportantly restricted.

An optically appealing design is achieved in that the air passage grating comprises a shield which optically covers the hinges and the retainer and the catch to the front side. The shield may be integrally formed to the air passage grating, so that a minimum number of components is required.

According to a further variant of the invention, it may be provided that the air passage grating is formed as a louvered grille having a plurality of convexly curved louvers and that the shield adjoins the region of the last louver and is also convexly curved, so the shield integrates to the design which is predefined by the louvers.

The invention will be explained in detail below with the aid of exemplary embodiments illustrated in the drawings. It is shown in:

DETAILED DESCRIPTION OF THE INVENTION

Figure 1:
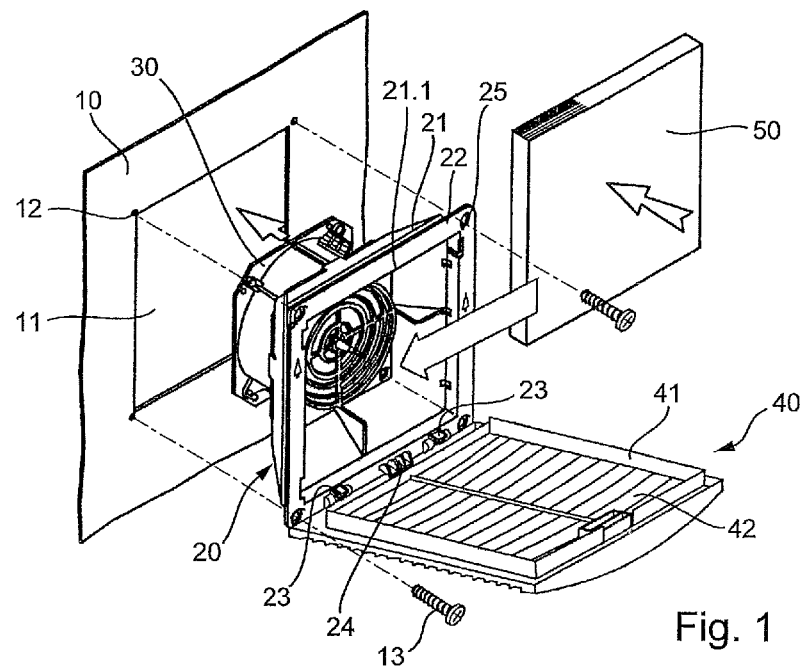
FIG. 1 in a perspective front view and in exploded illustration a wall element of a switchgear cabinet having a filter unit.

FIG. 1 shows a wall element 10 of a switchgear cabinet. Typically, wall element 10 is a vertical side wall, a rear wall or a front side door of the switchgear cabinet. Wall element 10 comprises a square opening 11, where screw seats 12 are allocated in the corner regions thereof. A filter unit may be inserted into opening 11. Presently, the filter unit comprises a filter housing 20 enclosing an air guiding region with housing wall 21. Housing wall 21 merges into a bottom 21.1 and is formed grid-like for passing air. Further, a fan unit 30 is flange-mounted to bottom 21.1. Fan unit 30 includes an electromotor and a fan provided to suck-in ambient air and to blow it into the interior of the switchgear cabinet, as symbolized by the arrow representation in FIG. 1. Facing away from fan unit 30, a continuous flange 22 is formed to the housing wall 21. With the aid of flange 22, the inserting movement of filter housing 20 into opening 11 may be limited. To this end, flange 22 abuts to wall element 10 around opening 11. Flange 22 comprises screw seats 25 in its corner regions. Fixing screws 13 may be guided therethrough and screwed into the screw seats of wall element 10. In this way, filter housing 20 is fixedly connected to wall element 10.

As may be further recognized in FIG. 1, an air passage grating 40 is connected to filter housing 20. Air passage grating 40 is at its lower horizontal edge coupled to the lower horizontal edge of filter housing 20 via two hinges 23. Hinges 23 define a horizontal hinge axis around which air passage grating 40 may be moved between a vertical mounting position and a folded down maintenance position seen in FIG. 1.

Air passage grating 40 comprises three adjacent walls which are used as a mat holder 41 for a filter mat 50. Filter mat 50 may be inserted into mat holder 41. Filter mat 50 abuts on louvers 42 of the air passage grating 40 with its front side. Louvers 42 form air input openings through which ambient air can be conveyed through filter mat 50 into filter housing 20 and fan unit 30 into the interior of the switchgear cabinet.

A catch device is effective between air passage grating 40 and filter housing 20 which retains air passage grating 40 in the maintenance position which can be recognized in FIG. 1. A retainer 24 is integrally formed to filter housing which retainer engages a catch 46. Allocation of holder 24 and the catch 46 is explained in detail below with reference to FIGS. 5 and 6.

Figure 2:
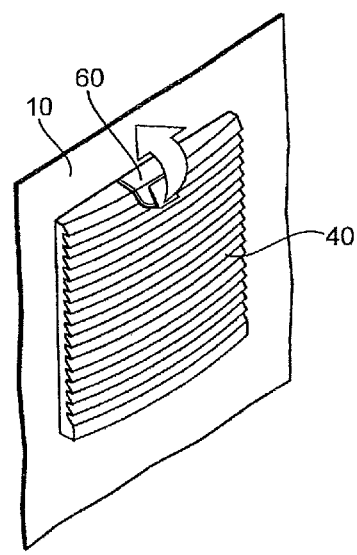
FIG. 2 the illustration of FIG. 1 in an assembled state.
Figure 3:
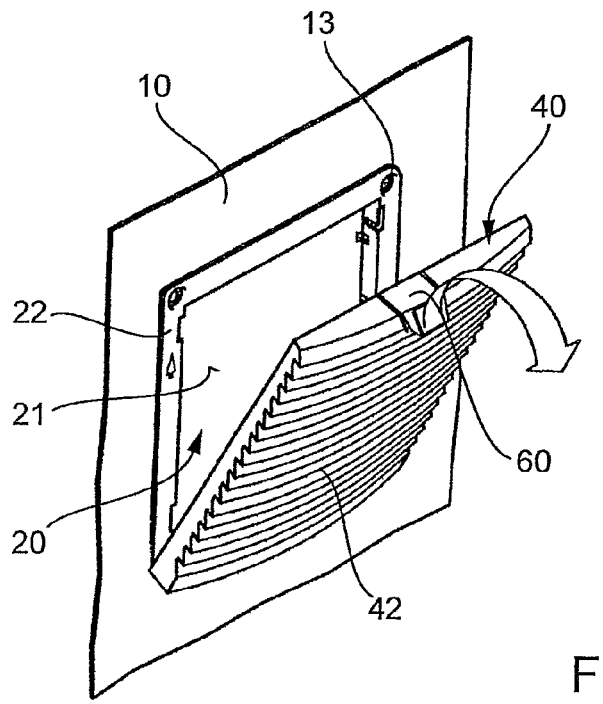
FIG. 3 a filter unit having an air passage grating in perspective front view.

When air passage grating 40 is in its maintenance position, a filter mat 50 may be inserted. Subsequently, air passage grating 40 is pivoted into its vertical position, as may be recognized in FIG. 2. A locking mechanism 60 is provided at the upper horizontal edge of air passage grating 40, by which air passage grating 40 may be detachably fixed to filter housing 20. When that locking mechanism 60 is released (see arrow representations of FIG. 2), air passage grating 40 may be again folded down into a maintenance position, as illustrated by FIG. 3.

Figure 4:
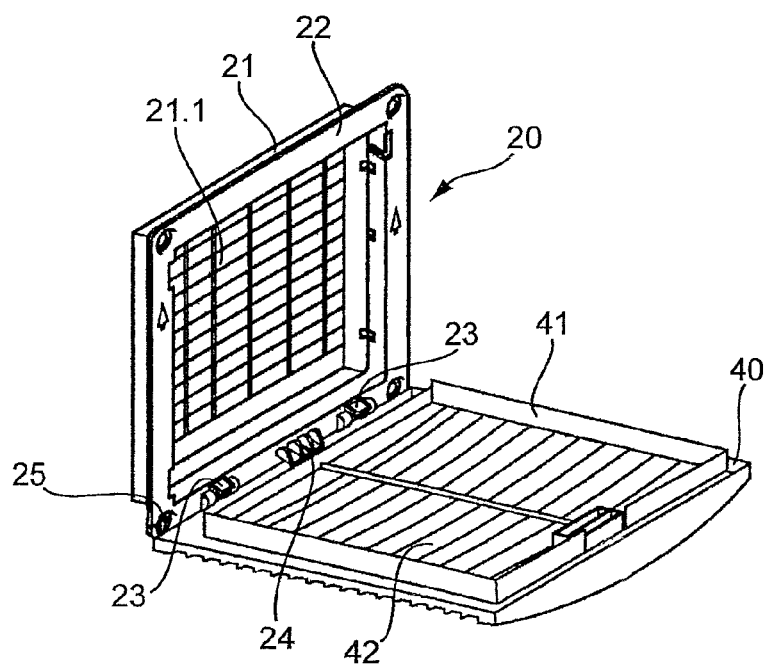
FIG. 4 the filter unit of FIG. 3 in a maintenance position.
Figure 5:
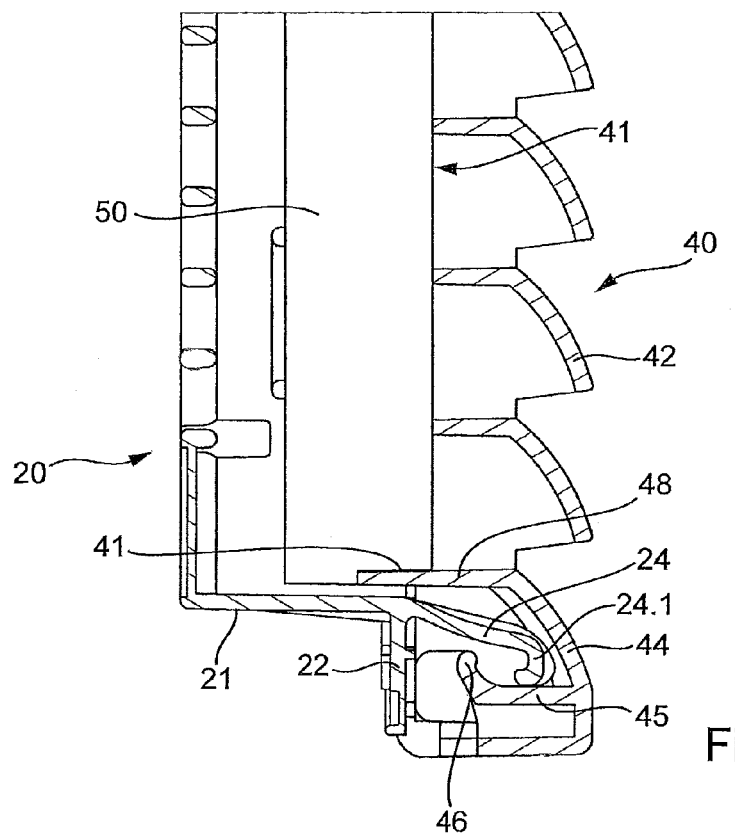
FIG. 5 in an enlarged illustration of details a vertical section of the filter unit of FIG. 5 in a modified mounting position.
Figure 6:
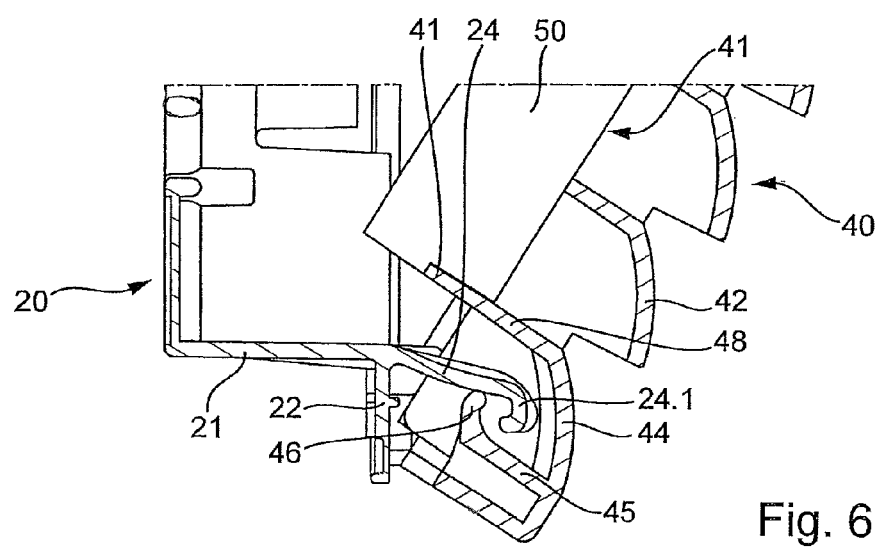

In FIGS. 4 to 6, a further variant of embodiment of the invention is illustrated. Configuration of the air passage grating 40 is identical to that of FIGS. 1-3. A pass-through housing is used as filter housing 20, wherein no fan unit 30 is flanged-mounted thereto. Rather, filter housing 20 comprises a housing wall 21 which is closed by a bottom with grid 21.1. Further, a flange 22 is provided identically to the configuration of FIGS. 1 to 3 which may be fixed at an opening 11 of a wall element 10 (according to FIG. 1) as already previously described. Identical with the configuration according to FIGS. 1 to 3, two hinges 23, a retainer 24 and a catch 46 in the range of the hinges are provided.

With reference to FIGS. 5 and 6, the correlation between catch 46 and retainer 24 is commented in detail below. It should be mentioned here that the embodiment of this region is identical for both variants of embodiment according to FIGS. 1 to 3 or 4 to 6.

Accordingly, retainer 24 is integrally formed to housing wall 21 in the region of the lower horizontal flange 22. Retainer 24 is configured such that it forms a leaf spring-like geometry. At its free end, retainer 24 comprises a hook tab 24.1. Air passage grating 40 is closed in the region of a lower horizontal wall element 48 which simultaneously forms the lower part of mat holder 41. Wall element 48 supports a convexly curved shield. The curvature thereof is identical to the curvature of louvers 42, so that shield 44 optically mimics the shape of a louver 42.

Inside the shield 44, a bar 45 is formed thereto which integrally carries hook-shaped catch 46. If now air passage grating 40, starting from its operating position illustrated in FIG. 5, is folded down in hinges 23, it will reach the position of FIG. 6 at a specific adjustment angle. Then, catch 46 meets retainer 24. When retainer 24 is formed to the house wall 21 via a spring element, it is resiliently deviated upwardly and applies a pressure force to catch 46. In this way, a decelerating effect is produced between catch 46 and retainer 24 when further pivoting the louvered grille, wherein a friction surface of retainer 24 slides along a counter friction surface of catch 46. Thus, a decelerating force is created which counteracts the fold-down movement of the air passage grating 40. The pivoted move of air passage grating 40 is limited with hook tab 24.1 of retainer 24. When the maintenance position is reached, catch 46 positively engages hook tab 24.1 and thus prevents further folding down of air passage grating 40. Air passage grating 40 is then in a position shown in FIG. 1 or FIG. 4, respectively. In this maintenance position, filter mat 50 may conveniently be replaced.

The invention claimed is:

1. A filter unit for a switchgear cabinet, comprising a filter mat and filter housing having an air passage that can be covered by an air passage grating at least to some extent, wherein the air passage grating is hinged indirectly or directly to the filter housing by a hinge defining a single horizontal axis around which the air passage grating may be moved between a closed position and an opened maintenance position, and the filter housing has a retainer which is formed to the housing via a spring element and positively blocks a catch of the air passage grating in the maintenance position, wherein the retainer and the catch are configured such that when the air passage grating is pivoted relative to the filter housing to a specific adjustment angle, the air passage grating reaches a position where the catch meets the retainer, wherein upon further pivoting the air passage grating, a friction surface of the retainer slides along a counter friction surface of the catch and the spring element is resiliently deviated upwardly and applies a pressure force to the catch, and wherein each retainer and catch comprises a hook-shaped tab, which engage each other in the maintenance position.

2. The air filter unit of claim 1, wherein a damper is effective between the air passage grating and the filter housing which at least in a part of the opening stroke decelerates the pivoting motion of the air passage grating.

3. The air filter unit of claim 2, wherein the damper is a friction damper.

4. The air filter unit of claim 1, wherein the air passage grating comprises a mat holder retaining a filter mat replaceably.

5. The air filter unit of claim 1, wherein the air passage grating carries the catch in the region of the hinge side.

6. The air filter unit of claim 5, wherein the air grating passage comprises a shield optically covering the hinge and retainer and catch to the front side.

7. The air filter unit of claim 6, wherein the air passage grating is formed as a louvered grille having a plurality of convexly curved louvers and that the shield adjoins in the region of the last louver and is also convexly curved.

8. The air filter unit of claim 1, comprising a pair of hinges defining a single horizontal axis around which the air passage grating may be moved between the closed position and the opened maintenance position, wherein the retainer and catch are positioned between the pair of hinges.

9. The air filter unit of claim 1, wherein the retainer is configured such that it forms a leaf spring-like geometry.

* * * * *